United States Patent
Hin et al.

(10) Patent No.: US 11,156,346 B2
(45) Date of Patent: Oct. 26, 2021

(54) FAN OUT STRUCTURE FOR LIGHT-EMITTING DIODE (LED) DEVICE AND LIGHTING SYSTEM

(71) Applicant: Lumileds LLC, San Jose, CA (US)

(72) Inventors: Tze Yang Hin, Cupertino, CA (US); Anantharaman Vaidyanathan, San Jose, CA (US); Srini Banna, San Jose, CA (US); Ronald Johannes Bonne, Plainfield, IL (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 16/750,809

(22) Filed: Jan. 23, 2020

(65) Prior Publication Data

US 2021/0148553 A1    May 20, 2021

Related U.S. Application Data

(60) Provisional application No. 62/951,601, filed on Dec. 20, 2019, provisional application No. 62/937,629, filed on Nov. 19, 2019.

(51) Int. Cl.
*F21V 23/00* (2015.01)
*F21S 41/153* (2018.01)
(Continued)

(52) U.S. Cl.
CPC .......... *F21V 23/002* (2013.01); *F21S 41/153* (2018.01); *H01L 27/156* (2013.01); *H01L 33/62* (2013.01);
(Continued)

(58) Field of Classification Search
CPC ..... F21V 23/002; F21S 41/153; F21S 41/141; F21S 41/192; H01L 33/62; H01L 27/156;
(Continued)

(56) References Cited

U.S. PATENT DOCUMENTS 6,936,855 B1   8/2005  Harrah
8,513,790 B2 * 8/2013  Chen .................... H01L 33/62
                                                257/678
(Continued)

FOREIGN PATENT DOCUMENTS

EP   3113236 A1   1/2017
EP   3582593 A1   12/2019
(Continued)

OTHER PUBLICATIONS

U.S. Appl. No. 62/954,121, filed Dec. 27, 2019.
(Continued)

*Primary Examiner* — Peggy A Neils
(74) *Attorney, Agent, or Firm* — Volpe Koenig

(57) ABSTRACT

LED lighting systems and vehicle headlamp systems are described. An LED lighting system includes a silicon backplane having a top surface, a bottom surface, and side surfaces and a substrate surrounding the side surfaces of the silicon backplane, the substrate having a top surface, a bottom surface and side surfaces. First redistribution layers are provided on the top surface of the silicon backplane and the top surface of the substrate. Second redistribution layers are provided on the bottom surface of the silicon backplane and the bottom surface of the substrate. At least one via extends through the substrate between the first redistribution layers and the second redistribution layers and is filled with a metal material.

19 Claims, 12 Drawing Sheets

(51) Int. Cl.
*H01L 27/15* (2006.01)
*H01L 33/62* (2010.01)
*F21Y 105/10* (2016.01)
*F21Y 115/10* (2016.01)

(52) U.S. Cl.
CPC ....... *F21Y 2105/10* (2016.08); *F21Y 2115/10* (2016.08)

(58) Field of Classification Search
CPC ............... H01L 25/167; F21Y 2105/10; F21Y 2115/10; H05K 3/4694
See application file for complete search history.

(56) References Cited

U.S. PATENT DOCUMENTS

| | | |
|---|---|---|
| 8,912,650 B2 | 12/2014 | Choi et al. |
| 9,615,453 B2 | 4/2017 | Yang |
| 9,653,397 B2 | 5/2017 | Kwon et al. |
| 9,899,465 B2 | 2/2018 | Bower et al. |
| 10,005,384 B2* | 6/2018 | Canonne ............... H01L 27/156 |
| 10,205,055 B2* | 2/2019 | Chu ........................ H01L 33/32 |
| 10,529,690 B2 | 1/2020 | Shih et al. |
| 10,665,578 B2* | 5/2020 | Huitema ................. H01L 24/24 |
| 10,683,986 B2* | 6/2020 | Lefaudeux ............. F21V 5/004 |
| 2003/0020156 A1 | 1/2003 | Farquhar et al. |
| 2005/0263867 A1 | 12/2005 | Kambe et al. |
| 2006/0141851 A1 | 6/2006 | Matsui et al. |
| 2010/0039817 A1 | 2/2010 | Wen et al. |
| 2010/0155746 A1 | 6/2010 | Ibbetson et al. |
| 2011/0030209 A1 | 2/2011 | Chang et al. |
| 2011/0121347 A1 | 5/2011 | Liu et al. |
| 2012/0175643 A1 | 7/2012 | West |
| 2012/0273960 A1 | 11/2012 | Park et al. |
| 2013/0193463 A1 | 8/2013 | Kong et al. |
| 2013/0221452 A1 | 8/2013 | Strothmann et al. |
| 2014/0021493 A1 | 1/2014 | Andrews et al. |
| 2014/0061930 A1 | 3/2014 | Holmes et al. |
| 2014/0306845 A1 | 10/2014 | Shiu et al. |
| 2015/0054001 A1 | 2/2015 | Oganesian et al. |
| 2015/0054406 A1 | 2/2015 | Gershowitz et al. |
| 2015/0084206 A1 | 3/2015 | Lin |
| 2015/0319868 A1 | 11/2015 | Wei et al. |
| 2015/0371585 A1* | 12/2015 | Bower ..................... H05K 1/09 345/1.1 |
| 2016/0050771 A1 | 2/2016 | Yu et al. |
| 2016/0172402 A1 | 6/2016 | Katkar |
| 2016/0324004 A1 | 11/2016 | Schwarz et al. |
| 2017/0009978 A1* | 1/2017 | Hong ..................... H01L 33/64 |
| 2017/0025593 A1 | 1/2017 | Bower et al. |
| 2017/0040306 A1 | 2/2017 | Kim et al. |
| 2017/0062383 A1 | 3/2017 | Yee et al. |
| 2017/0358562 A1 | 12/2017 | Banna et al. |
| 2018/0166373 A1 | 6/2018 | Lin et al. |
| 2018/0175262 A1* | 6/2018 | Jansen ................... H01L 33/54 |
| 2018/0226386 A1 | 8/2018 | Cok |
| 2018/0269188 A1 | 9/2018 | Yu et al. |
| 2018/0337135 A1 | 11/2018 | Yoshihiro et al. |
| 2018/0337142 A1 | 11/2018 | Cheng et al. |
| 2019/0006283 A1 | 1/2019 | Wang et al. |
| 2019/0056067 A1 | 2/2019 | Price et al. |
| 2019/0075656 A1 | 3/2019 | Kim et al. |
| 2019/0096864 A1 | 3/2019 | Huitema et al. |
| 2019/0181315 A1 | 6/2019 | Liao et al. |
| 2019/0206833 A1 | 7/2019 | Meyer et al. |
| 2019/0305205 A1 | 10/2019 | Feichtinger |
| 2019/0333444 A1 | 10/2019 | He et al. |
| 2019/0360673 A1 | 11/2019 | Seo |
| 2019/0385513 A1 | 12/2019 | Iguchi et al. |
| 2020/0105638 A1 | 4/2020 | Chiang et al. |
| 2020/0119235 A1 | 4/2020 | Ahmed et al. |
| 2020/0251626 A1* | 8/2020 | Lee ........................ H01L 33/44 |
| 2021/0028766 A1 | 1/2021 | Hurwitz et al. |
| 2021/0125971 A1 | 4/2021 | Chu et al. |

FOREIGN PATENT DOCUMENTS

| | | |
|---|---|---|
| JP | 2011-113989 A | 6/2011 |
| KR | 10-2013-0036650 A | 4/2013 |
| TW | 200830975 A | 7/2008 |
| TW | 200942105 A | 10/2009 |
| WO | 2018/116814 A1 | 6/2018 |
| WO | 2018/172152 A1 | 9/2018 |
| WO | 2019/013469 A1 | 1/2019 |
| WO | 2019/168763 A1 | 9/2019 |

OTHER PUBLICATIONS

U.S. Appl. No. 16/814,024, filed Mar. 10, 2020.
U.S. Appl. No. 16/809,104, filed Mar. 4, 2020, which claims the benefit of U.S. Appl. No. 62/958,058, filed Jan. 7, 2020.
U.S. Appl. No. 16/831,378, filed Mar. 26, 2020, which claims the benefit of U.S. Appl. No. 62/826,612, filed Mar. 29, 2019.
U.S. Appl. No. 16/831,384, filed Mar. 26, 2020, which claims the benefit of U.S. Appl. No. 62/826,612, filed Mar. 29, 2019.
Extended European Search Report dated Oct. 19, 2020 for the European Patent Application No. 20169027.8.
Extended European Search Report dated Sep. 2, 2020 for European Patent Application No. 20158481.0.
Extended European Search Report dated Jul. 7, 2020 for European Patent Application No. 20157985.1.
Extended European Search Report dated Jul. 30, 2020 for European Patent Application No. 20158288.9.
Extended European Search Report dated Sep. 11, 2020 for European Patent Application No. 20166601.3.
International Search Report and Written Opinion dated Feb. 11, 2021 for PCT International Application No. PCT/US2020/061205.
International Search Report and Written Opinion dated Feb. 17, 2021 for PCT International Application No. PCT/US2020/061206.
Annex to Form PCT/ISA/206, Communication Relating to the Results of the Partial International Search dated Mar. 4, 2021 for PCT International Application No. PCT/US2020/061201.
International Search Report and Written Opinion dated Apr. 8, 2021 for PCT International Application No. PCT/US2021/012425.
International Search Report and Written Opinion dated Apr. 16, 2021 for PCT International Application No. PCT/US2020/066998.
International Search Report and Written Opinion dated Apr. 28, 2021 for PCT International Application No. PCT/US2020/061201.
International Search Report and Written Opinion dated Jun. 29, 2021 for PCT International Application No. PCT/US2021/021702.

* cited by examiner

FAN OUT STRUCTURE FOR LIGHT-EMITTING DIODE (LED) DEVICE AND LIGHTING SYSTEM

CROSS REFERENCE TO RELATED APPLICATIONS

This application claims the benefit of U.S. Provisional Application Nos. 62/937,629, which was filed on Nov. 19, 2019, and 62/951,601, filed Dec. 20, 2019 the contents of which are hereby incorporated by reference herein.

BACKGROUND

Precision control lighting applications may require production and manufacturing of small addressable light-emitting diode (LED) lighting systems. The smaller size of such systems may require unconventional components and manufacturing processes.

SUMMARY

LED lighting systems, vehicle headlamp systems and methods of manufacture are described. An LED lighting system includes a silicon backplane having a top surface, a bottom surface, and side surfaces and a substrate surrounding the side surfaces of the silicon backplane, the substrate having a top surface, a bottom surface and side surfaces. First redistribution layers are provided on the top surface of the silicon backplane and the top surface of the substrate. Second redistribution layers are provided on the bottom surface of the silicon backplane and the bottom surface of the substrate. At least one via extends through the substrate between the first redistribution layers and the second redistribution layers and is filled with a metal material.

BRIEF DESCRIPTION OF THE DRAWINGS

A more detailed understanding can be had from the following description, given by way of example in conjunction with the accompanying drawings wherein:

FIG. 10 is a top view of the example LED lighting system of FIG. 1B;

DETAILED DESCRIPTION

Figure 1A:
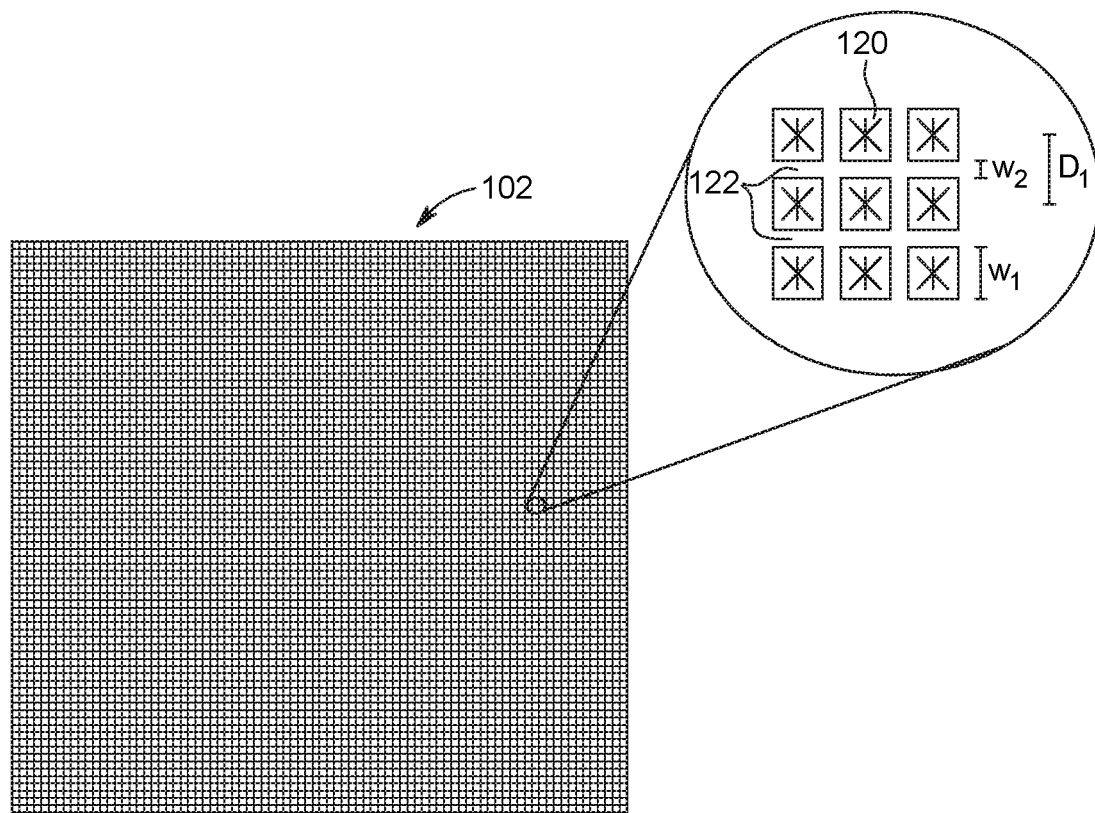
FIG. 1A is a top view of an example LED array.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Further, whether the LEDs, LED arrays, electrical components and/or electronic components are housed on one, two or more electronics boards may also depend on design constraints and/or application.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

FIG. 1A is a top view of an example LED array 102. In the example illustrated in FIG. 1A, the LED array 102 is an array of emitters 120. LED arrays may be used for any application, such as those requiring precision control of LED array emitters. Emitters 120 in the LED array 102 may be individually addressable or may be addressable in groups/subsets.

An exploded view of a 3×3 portion of the LED array 102 is also shown in FIG. 1A. As shown in the 3×3 portion exploded view, the LED array 102 may include emitters 120 that each have a width $w_1$. In embodiments, the width $w_1$ may be approximately 100 μm or less (e.g., 40 μm). Lanes 122 between the emitters 120 may be a width, $w_2$, wide. In embodiments, the width $w_2$ may be approximately 20 μm or less (e.g., 5 μm). The lanes 122 may provide an air gap between adjacent emitters or may contain other material. A distance $d_1$ from the center of one emitter 120 to the center of an adjacent emitter 120 may be approximately 120 μm or less (e.g., 45 μm). It will be understood that the widths and distances provided herein are examples only and that actual widths and/or dimensions may vary.

It will be understood that, although rectangular emitters arranged in a symmetric matrix are shown in FIG. 1A, emitters of any shape and arrangement may be applied to the embodiments described herein. For example, the LED array 102 of FIG. 1A may include over 20,000 emitters in any applicable arrangement, such as a 200×100 matrix, a symmetric matrix, a non-symmetric matrix, or the like. It will also be understood that multiple sets of emitters, matrixes, and/or boards may be arranged in any applicable format to implement the embodiments described herein.

As mentioned above, LED arrays, such as the LED array 102, may include up to 20,000 or more emitters. Such arrays may have a surface area of 90 mm² or greater and may require significant power to power them, such as 60 watts or more. An LED array such as this may be referred to as a micro LED array or simply a micro LED. A micro LED may include an array of individual emitters provided on a substrate or may be a single silicon wafer or die divided into segments that form the emitters. The latter type of micro LED may be referred to as a monolithic LED.

To individually drive or control the individual LEDs in the array, a silicon backplane may be provided in close proximity to the LED array and may become extremely hot during operation. Accordingly, heat dissipation can be challenging for such devices. While some solutions are known for heat dissipation for semiconductor devices, such solutions often include structures that dissipate heat through the top of the device. Due to light-emission, however, LED arrays, such as the LED array 102 of FIG. 1A, may not be able to dissipate heat through the top of the device.

Additionally, LED arrays, such as the LED array 102, may be used in applications, such as for vehicle headlamp systems, which may include passive elements, such as resistors and capacitors, which may form drivers, controllers and other circuits. It may be desirable to package at least some passive elements with the LED array.

Embodiments described herein may provide for a low profile LED array package that may accommodate one or more passive elements and enable dissipation of heat generated by the silicon backplane and the LED array.

Figure 1B:
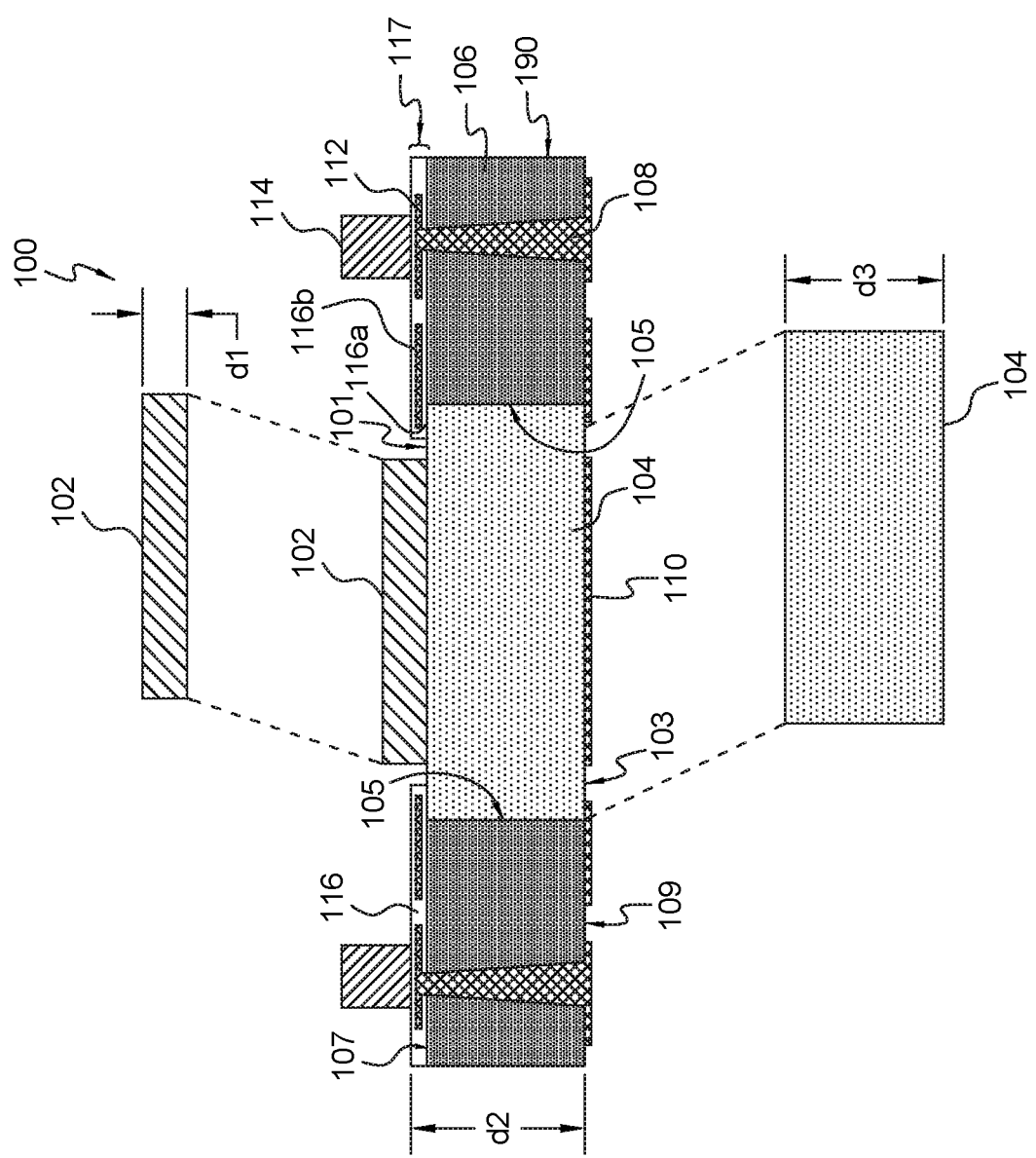
FIG. 1B is a cross-sectional view of an example LED lighting system.

FIG. 1B is a diagram of a cross-sectional view of an example LED lighting system 100. In the example illustrated in FIG. 1B, the LED lighting system 100 includes a silicon backplane 104. The silicon backplane 104 has a top surface 101, a bottom surface 103 and side surfaces 105. The side surfaces 105 of the silicon backplane 104 are surrounded by a substrate 106 formed from a molding material. The substrate 106 has a top surface 107, a bottom surface 109 and side surfaces 190. One or more metal layers 110 or redistribution layers (RDL) (shown in the alternative embodiment in FIG. 6E) are provided on the bottom surface 103 of the silicon backplane 104 and the bottom surface 109 of the substrate 106. RDL 117 may be formed on at least a portion of the top surface 101 of the silicon backplane 104 and a top surface 107 of the substrate 106. In the example illustrated in FIG. 1B, the RDL 117 includes two layers 116a and 116b of a dielectric material 116 and a single metal layer 112. One or more vias 108 may extend through the substrate 106 and may be filled with a metal material. The vias may thus form a continuous electrical connection between the silicon backplane 104, the RDL 117 and the metallization/RDL 110. An LED array, such as the LED array 102 of FIG. 1A, may be provided on the top surface 101 of the silicon backplane 104 and electrically coupled thereto via an array of metal connectors (not shown in FIG. 1B). In embodiments, electronic components 114 may be provided on the RDL 117 and electrically coupled to the LED lighting system 100 via the metal layer 112.

The LED array 102 may be a micro LED, such as described above with respect to FIG. 1A. The LED array 102 may have a depth d1. In embodiments, the depth d1 may be, for example, between 5 and 250 μm.

The silicon backplane 104 may include the circuitry and connectors that make individually addressable connections to the emitters in the LED array 102. In embodiments, the silicon backplane may be a complementary metal-oxide semiconductor (CMOS) integrated circuit, which, in embodiments, may be an application specific integrated circuit (ASIC). The silicon backplane 104 may have a depth d3. In embodiments, the depth d3 may be, for example, between 100 μm and 1 mm.

A structure made up of the silicon backplane 104, the substrate 106, the metallization/RDL 110, the RDL 117 and the vias 108 may have a depth d2. In embodiments, the depth d2 may be, for example, between 100 μm and 1 mm. Since the silicon backplane 104 is integrated into the substrate, and the LED array 102 is provided on top of the silicon backplane 104, the LED lighting system 100 may have a lower profile relative to systems that vertically stack one or more of these elements.

In the example illustrated in FIG. 1B, the RDL 117 includes two layers 116a and 116b of the dielectric material 116 and a single metal layer 112. The first layer 116a of the two layers of the dielectric material 116 may be on the top surface 107 of the substrate 106 and at least a portion of the top surface 101 of the silicon backplane 104. The metal layer 112 may be patterned on the first layer 116a of the dielectric material 116, such as by copper plating and copper etching. The second layer 116b of the dielectric material 116 may be on top of the patterned metal layer 112 and exposed portions of the first layer 116a of the dielectric material 116. Although RDL consisting of two layers of dielectric material and a single layer of metal are shown in FIG. 1B, one of ordinary skill in the art will recognize that the RDL 117 may include more or less layers of the dielectric material and/or more metal layers, depending on design constraints. The dielectric material 116 may be any suitable dielectric material. In embodiments, the dielectric material may be a polymer dielectric material, such as polyimide.

The RDL 117 may extend from a perimeter region of the silicon backplane 104 towards the side surfaces 190 of the substrate 106. This may both accommodate the LED array 102 attached to the top surface 101 of the silicon backplane 104 in a central region and help with heat dissipation by containing the dielectric materials that may further insulate the LED lighting system 100 to areas away from the highest heat areas in the center of the LED lighting system 100. The metal layer 112 may have portions that are exposed from the dielectric material 116 to form bond pads. The metal layer 112 may include portions that extend between the perimeter region of the silicon backplane 104 and the bond pads to create a continuous electrical connection therebetween. The bond pads may be electrically coupled to the vias 108 to create a continuous electrical connection between top and bottom surfaces of the LED lighting system 100. The bond pads may be placed in the perimeter region of the substrate or spaced apart from but closer to the array (as shown in FIG. 10, for example).

The metallization/RDL 110 may be formed in a number of different ways. In the example illustrated in FIG. 1B, the metallization/RDL 110 is a metal layer including a first portion that is electrically and thermally coupled to the bottom surface 103 of the silicon backplane 104 in a central region and second portions that fan out from a perimeter region of the silicon backplane 104 toward the side surfaces 190 of the substrate 106. The first portion and the second portions may be electrically insulated from one another in embodiments. Although not visible in FIG. 1B, the second portions may extend from the silicon backplane 104 and join with individual vias 108 at bond pads, electrically coupling the silicon backplane 104 to the metal layer 112 on the top surface. Both the first and second portions of the metal layer 110 may be coupled to an external circuit board (not shown), such as by soldering. This may enable a direct connection between the LED lighting system 100 and the external circuit board, which provides improved heat sinking through the bottom of the LED lighting system. Additionally, this structure may enable communication between the silicon backplane 104, the LED array 102, the passive components 114 on the substrate 106 and any electronic components on the external circuit board.

In another example, which will be described in more detail later with respect to FIGS. 6E and 7, the metallization/RDL 110 may be a combination of a metal layer and RDL. As with the embodiment illustrated in FIG. 1B, a metal layer may be electrically and thermally coupled to the bottom surface 103 of the silicon backplane 104 in a central region. The fanout, however, may be accomplished using RDL instead of the metal layer. In such embodiments, the LED lighting device 100 may have RDL on both the top and bottom surfaces.

In both cases, the metallization/RDL 110 may be a thin structure compared to conventional silicon device packages and may include considerably less dielectric material than conventional silicon device packages. For example, the metal layer 100 in the embodiment shown in FIG. 1B may be a single metal layer, and the RDL may include as few dielectric layers as possible. This may increase the efficiency of the heat dissipation in such packages and enable packaging for micro-LEDs and CMOS backplanes that may emit substantial heat.

In the LED lighting system 100 illustrated in FIG. 1B, the top surface 101 of the silicon backplane 104 and the top surface 107 of the substrate 106 are co-planar. Similarly, the bottom surface 103 of the silicon backplane 104 and the bottom surface 109 of the substrate 106 are co-planar. This arrangement may allow for the slimmest possible packaging and ease of manufacture. However, one of ordinary skill in the art will recognize that because the substrate 106 is molded, the substrate 106 may take any shape, such as, for example, where the substrate has a top surface 107 that is higher than the top surface 101 of the silicon backplane 104 to further distance the electronic components 114 from the high heat regions of the LED lighting system 100. Thus, in embodiments, these surfaces may not be co-planar.

Figure 1C:
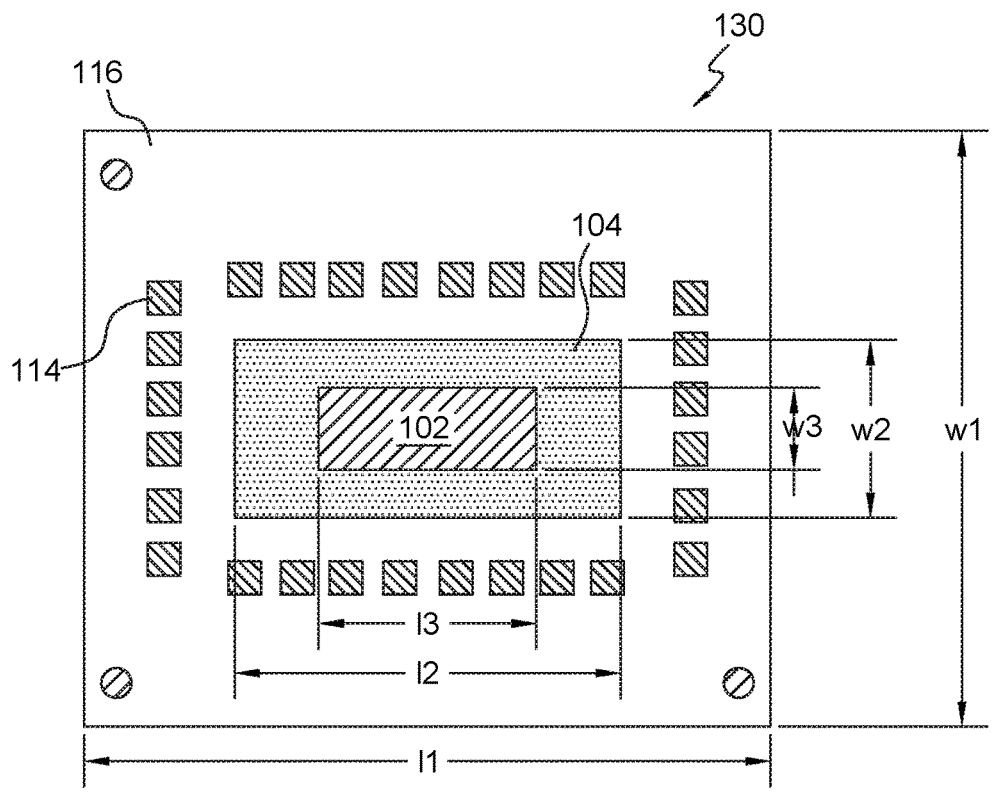
FIG. 1D is a bottom view of the example LED lighting system of FIG. 1B.

FIG. 1C is a top view showing a top surface 130 of the example LED lighting system 100 of FIG. 1B. In the example illustrated in FIG. 1C, the top surface 130 of the LED lighting system includes the top-most layer 116b of the dielectric material 116 in the RDL 117. Electronic components 114 are electrically coupled to the metal 112 in the RDL and exposed from the dielectric material 116. In embodiments, an electronic component 114 may not be electrically coupled to all regions of the metal 112 and, thus, the top surface 130 may, in embodiments, also include some regions of the metal 112 exposed from the dielectric material 116. A top surface of at least a portion of the silicon backplane 104 is shown in FIG. 1C and includes the portion of the top surface of the silicon backplane 104 that is not covered by the LED array 102 or the dielectric material 116. A top surface of the LED array 102 is also shown mounted on the top surface of the silicon backplane 104.

As shown in FIG. 10, the LED lighting system 100 has a length $\ell_1$ and a width $w_1$. In embodiments, the length $\ell_1$ may be approximately 20 mm and the width $w_1$ may be approximately 15 mm. The silicon backplane 104 may have a length $\ell_2$ and a width $w_2$. In embodiments, the length $\ell_2$ may be approximately 15.5 mm and the width $w_2$ may be approximately 6.5 mm. The LED array 102 may have a length $\ell_3$ and a width $w_3$. In embodiments, the length $\ell_3$ may be approximately 11 mm and the width cu may be approximately 4.4 mm.

Given these example dimensions, an LED array package may be provided that has a relatively large surface area (300 mm$^2$ in the above example) with a relatively large amount of the surface area not taken up by the LED array (which has a surface area of approximately 100 mm$^2$ in the above example). Accordingly, this design provides ample space for attachment of electronic components on the LED array package.

Figure 1D:
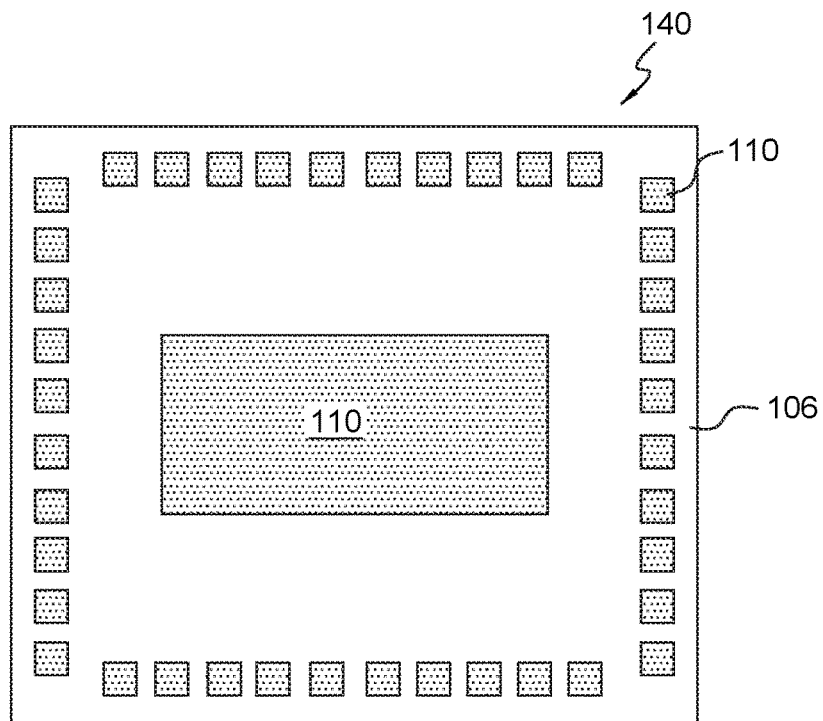

FIG. 1D is a bottom view showing a bottom surface 140 of the example LED lighting system 100 of FIG. 1B. In the example illustrated in FIG. 1D, the bottom surface 140 includes regions of the substrate 106 and regions of the metal 110 or solder pads coupled thereto that are exposed from the molding material 106. In embodiments, some regions of the substrate may be covered by metallization and/or portions of the RDL that interconnect the silicon backplane and the bond pads, although these are not shown in FIG. 1D. In some embodiments, the interconnecting metal regions and/or RDL may be covered by a dielectric material or other encapsulating or protective material (not shown in FIG. 1D).

Figure 2:
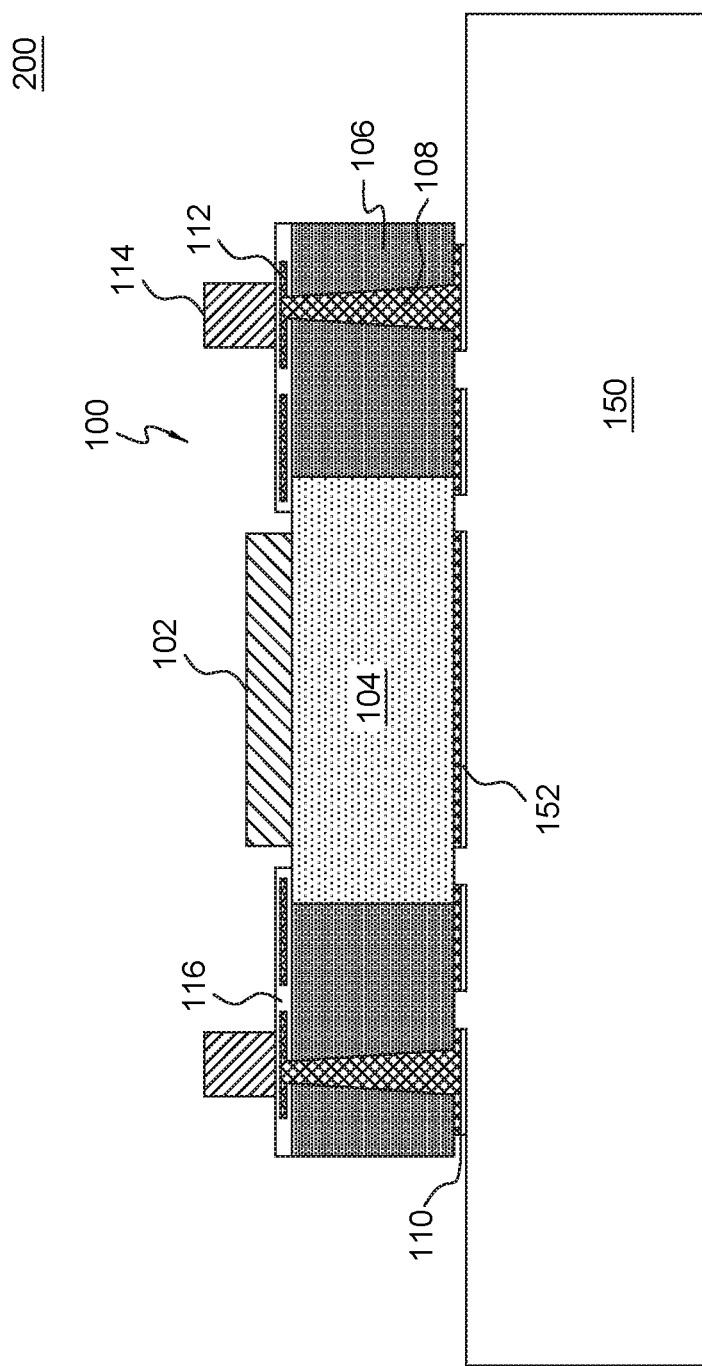
FIG. 2 is a cross-sectional view of an example application system that incorporates the LED lighting system of FIG. 1B.

FIG. 2 is a cross-sectional view of an application system 200 that incorporates the LED lighting system 100 of FIG. 1B. The application system 200 may include a circuit board 150 that has a number of bond pads 152. In the example illustrated in FIG. 2, exposed metal regions/bond pads of the RDL/metallization 110 of the LED lighting system 100 are bonded directly to the bond pads 152 of the circuit board 150. As mentioned above, the direct bond between the metal layer 110 on the bottom surface of the silicon backplane 104 and the circuit board 150 enables efficient heat transfer from the LED lighting system 100 to the circuit board 150 for heat sinking purposes without need for additional heat dissipating structures over the top of the LED lighting system 100 (or elsewhere) that may, for example, otherwise block light emission from the LED array 102. The circuit board 150 may be part of a larger system used in specific applications, such as vehicle lighting or flash applications (example vehicle lighting systems are described below with respect to FIGS. 3 and 4). In such systems, some of the passive components used in the application may be the components 114 and may be provided directly on the LED lighting system 100 before attachment to the circuit board 150. The circuit board 150 may include other circuit elements required for the larger system in addition to a heat sink. The RDL 117, the RDL/metallization 110 and the vias 108 may provide a continuous electrical connection between the components 114, the silicon backplane 104 and the circuit board 150.

Figure 3:
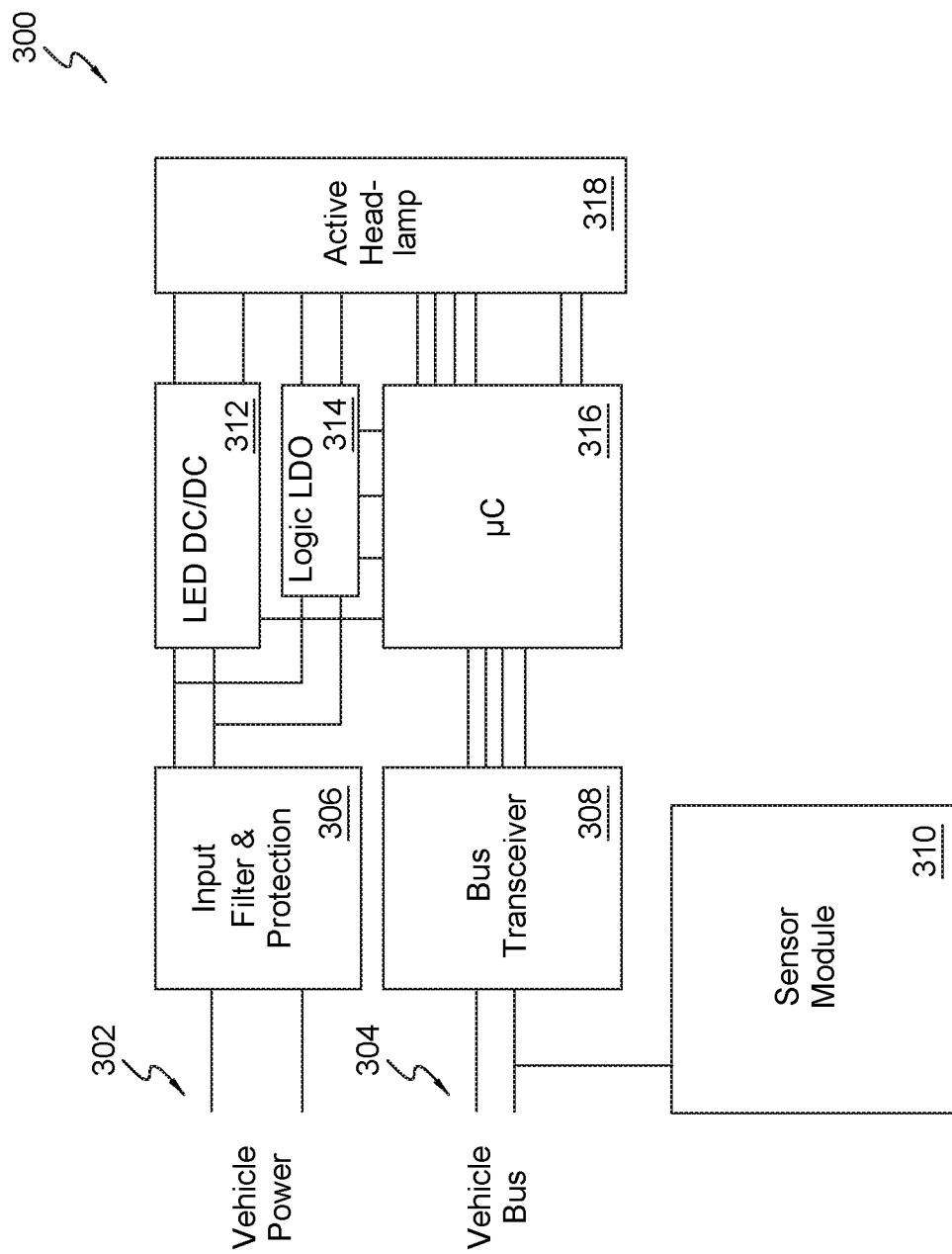
FIG. 3 is a diagram of an example vehicle headlamp system that incorporates the LED lighting system of FIG. 1B.

FIG. 3 is a diagram of an example vehicle headlamp system 300 that may incorporate the LED lighting system 100 of FIG. 1B. The example vehicle headlamp system 300 illustrated in FIG. 3 includes power lines 302, a data bus 304, an input filter and protection module 306, a bus transceiver 308, a sensor module 310, an LED direct current to direct current (DC/DC) module 312, a logic low-dropout (LDO) module 314, a micro-controller 316 and an active head lamp 318. In embodiments, the active head lamp 318 may include an LED lighting system, such as the LED lighting system 100 of FIG. 1B. As mentioned above, the LED lighting system 100 provides ample space and bond pads on the top surface of the substrate such that one, more, or all of the modules illustrated in FIG. 3 may be accommodated on the top surface of the LED lighting system 100. Modules not provided on the top surface of the LED lighting system 100 may be provided on the circuit board 150 (as shown in FIG. 2). In some embodiments, some electronic components of some or all of the modules in the vehicle lighting system 300 may be accommodated on the top surface of the LED lighting system 100 and some may be provided on the circuit board 150 (shown in FIG. 2).

The power lines 302 may have inputs that receive power from a vehicle, and the data bus 304 may have inputs/outputs over which data may be exchanged between the vehicle and the vehicle headlamp system 300. For example, the vehicle headlamp system 300 may receive instructions from other locations in the vehicle, such as instructions to turn on turn signaling or turn on headlamps, and may send feedback to other locations in the vehicle if desired. The sensor module 310 may be communicatively coupled to the data bus 304 and may provide additional data to the vehicle headlamp system 300 or other locations in the vehicle related to, for example, environmental conditions (e.g., time of day, rain, fog, or ambient light levels), vehicle state (e.g., parked, in-motion, speed of motion, or direction of motion), and presence/position of other objects (e.g., vehicles or pedestrians). A headlamp controller that is separate from any vehicle controller communicatively coupled to the vehicle data bus may also be included in the vehicle headlamp system 300. In FIG. 3, the headlamp controller may be a micro-controller, such as micro-controller (μc) 316. The micro-controller 316 may be communicatively coupled to the data bus 304.

The input filter and protection module 306 may be electrically coupled to the power lines 302 and may, for example, support various filters to reduce conducted emissions and provide power immunity. Additionally, the input filter and protection module 306 may provide electrostatic discharge (ESD) protection, load-dump protection, alternator field decay protection, and/or reverse polarity protection.

The LED DC/DC module 312 may be coupled between the filter and protection module 306 and the active headlamp 318 to receive filtered power and provide a drive current to power LEDs in the LED array in the active headlamp 318. The LED DC/DC module 312 may have an input voltage between 7 and 18 volts with a nominal voltage of approximately 13.2 volts and an output voltage that may be slightly higher (e.g., 0.3 volts) than a maximum voltage for the LED array (e.g., as determined by factor or local calibration and operating condition adjustments due to load, temperature or other factors).

The logic LDO module 314 may be coupled to the the input filter and protection module 306 to receive the filtered power. The logic LDO module 314 may also be coupled to the micro-controller 314 and the active headlamp 318 to provide power to the micro-controller 314 and/or the silicon backplane (e.g., CMOS logic) in the active headlamp 318.

The bus transceiver 308 may have, for example, a universal asynchronous receiver transmitter (UART) or serial peripheral interface (SPI) interface and may be coupled to the micro-controller 316. The micro-controller 316 may translate vehicle input based on, or including, data from the sensor module 310. The translated vehicle input may include a video signal that is transferrable to an image buffer in the active headlamp module 318. In addition, the micro-controller 316 may load default image frames and test for open/short pixels during startup. In embodiments, an SPI interface may load an image buffer in CMOS. Image frames may be full frame, differential or partial frames. Other features of micro-controller 316 may include control interface monitoring of CMOS status, including die temperature, as well as logic LDO output. In embodiments, LED DC/DC output may be dynamically controlled to minimize headroom. In addition to providing image frame data, other headlamp functions, such as complementary use in conjunction with side marker or turn signal lights, and/or activation of daytime running lights, may also be controlled.

Figure 4:
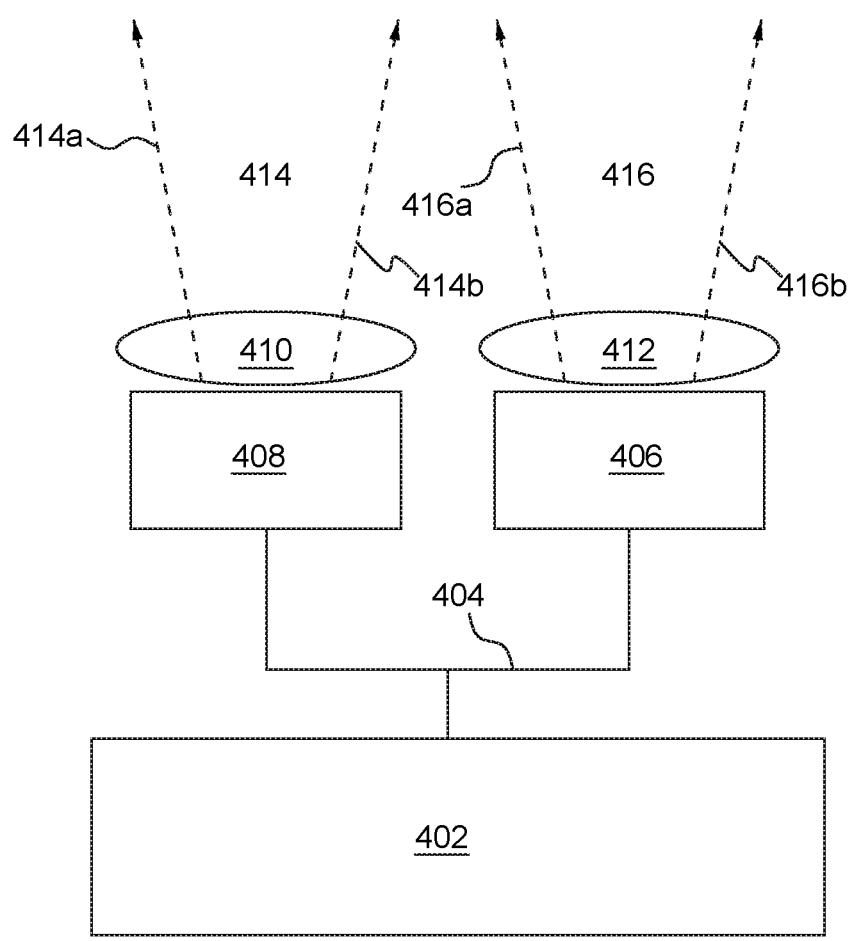
FIG. 4 is a diagram of another example vehicle headlamp system.

FIG. 4 is a diagram of another example vehicle headlamp system 400. The example vehicle headlamp system 400 illustrated in FIG. 4 includes an application platform 402, two LED lighting systems 406 and 408, and optics 410 and 412. The two LED lighting systems 406 and 408 may be LED lighting systems, such as the LED lighting system 100 of FIG. 1B, or may include the LED lighting system 100 plus some of all of the other modules in the vehicle headlamp system 300 of FIG. 3. In the latter embodiment, the LED lighting systems 406 and 408 may be vehicle headlamp sub-systems.

The LED lighting system 408 may emit light beams 414 (shown between arrows 414a and 414b in FIG. 4). The LED lighting system 406 may emit light beams 416 (shown between arrows 416a and 416b in FIG. 4). In the embodiment shown in FIG. 4, a secondary optic 410 is adjacent the LED lighting system 408, and the light emitted from the LED lighting system 408 passes through the secondary optic 410. Similarly, a secondary optic 412 is adjacent the LED lighting system 412, and the light emitted from the LED lighting system 412 passes through the secondary optic 412. In alternative embodiments, no secondary optics 410/412 are provided in the vehicle headlamp system.

Where included, the secondary optics 410/412 may be or include one or more light guides. The one or more light guides may be edge lit or may have an interior opening that defines an interior edge of the light guide. LED lighting systems 408 and 406 (or the active headlamp of a vehicle headlamp sub-system) may be inserted in the interior openings of the one or more light guides such that they inject light into the interior edge (interior opening light guide) or exterior edge (edge lit light guide) of the one or more light guides. In embodiments, the one or more light guides may shape the light emitted by the LED lighting systems 408 and 406 in a desired manner, such as, for example, with a gradient, a chamfered distribution, a narrow distribution, a wide distribution, or an angular distribution.

The application platform 402 may provide power and/or data to the LED lighting systems 406 and/or 408 via lines 404, which may include one or more or a portion of the power lines 302 and the data bus 304 of FIG. 3. One or more sensors (which may be the sensors in the system 300 or other additional sensors) may be internal or external to the housing of the application platform 402. Alternatively or in addition, as shown in the example LED lighting system 300 of FIG. 3, each LED lighting system 408 and 406 may include its own sensor module, connectivity and control module, power module, and/or LED array.

In embodiments, the vehicle headlamp system 400 may represent an automobile with steerable light beams where LEDs may be selectively activated to provide steerable light. For example, an array of LEDs (e.g., the LED array 102) may be used to define or project a shape or pattern or illuminate only selected sections of a roadway. In an example embodiment, infrared cameras or detector pixels within LED systems 406 and 408 may be sensors (e.g., similar to sensors in the sensor module 310 of FIG. 3) that identify portions of a scene (e.g., roadway or pedestrian crossing) that require illumination.

Figure 5:
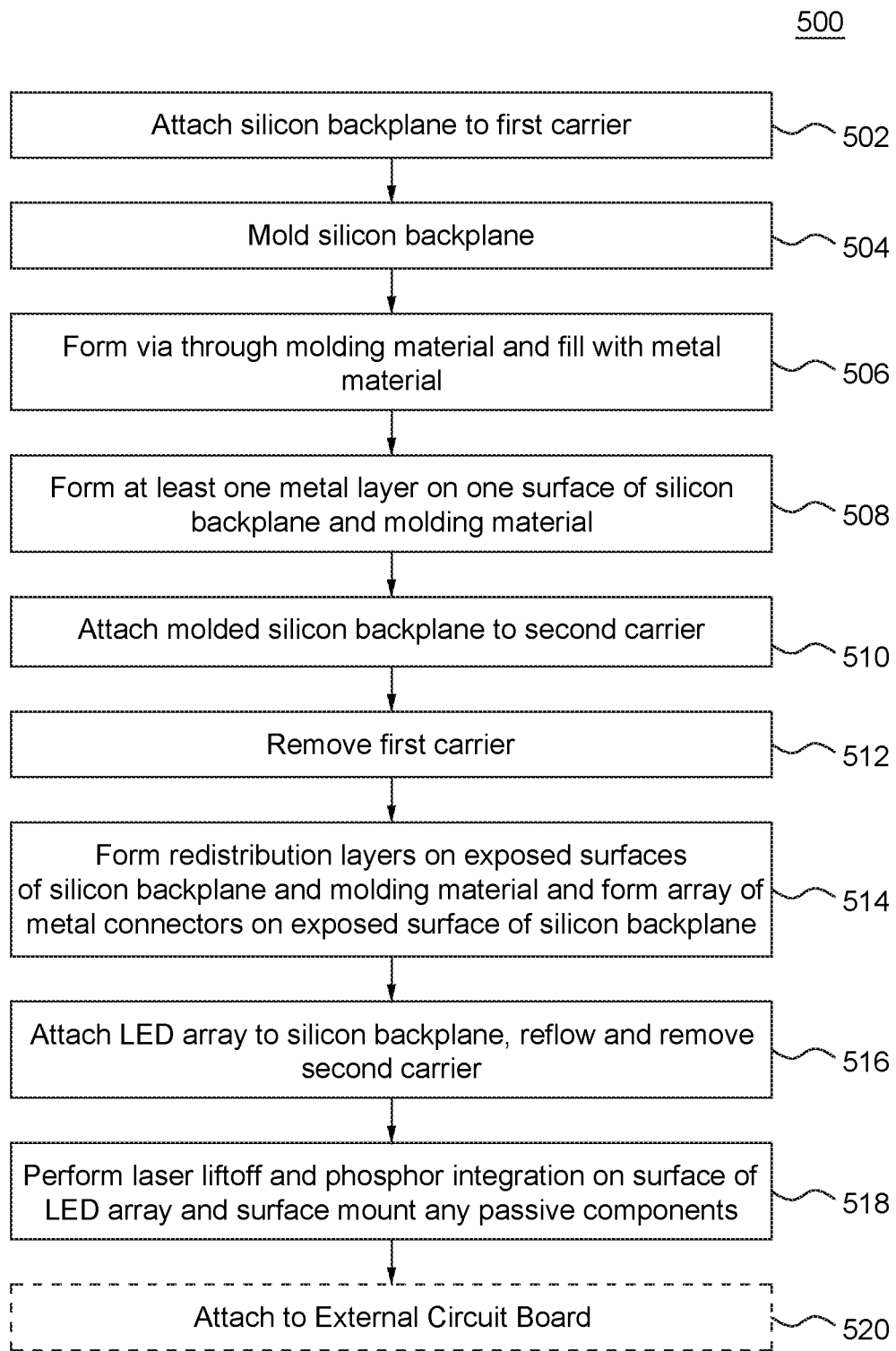
FIG. 5 is a flow diagram of an example method of manufacturing an LED lighting system, such as the LED lighting system of FIG. 1B.

FIG. 5 is a flow diagram of an example method 500 of manufacturing an LED lighting system, such as the LED lighting system 100 of FIG. 1B. FIGS. 6A, 6B, 6C, 6D, 6E, 6F, 6G, 6H, 6I and 6J are cross-sectional views of the LED lighting system at various stages in the manufacturing method. In embodiments, the method 500 may produce a panel level packaged high-density LED lighting system.

Figure 6A:
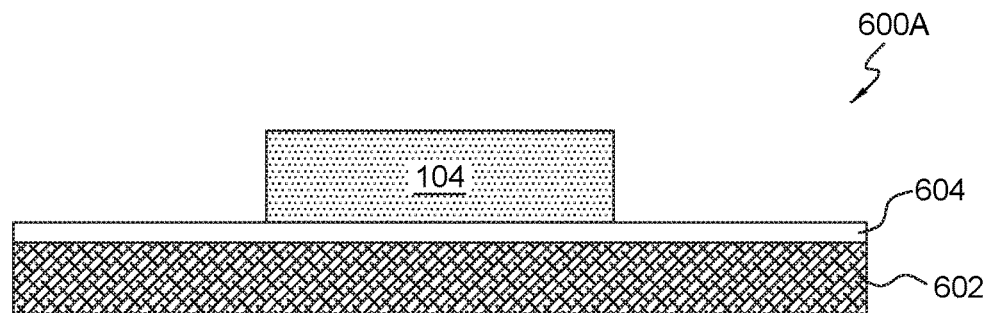
FIGS. 6A, 6B, 6C, 6D, 6E, 6F, 6G, 6H, 6I and 6J are cross-sectional views of the LED lighting system at various stages in the manufacturing method.

In the example method 500 of FIG. 5, the silicon backplane may be attached to a first carrier (502) to form a first structure. In embodiments, the silicon backplane may be attached to a temporary (e.g., plastic) carrier via an adhesive material, such as a tape or temporary adhesive. An example 600A of the first structure is illustrated in FIG. 6A and includes the silicon backplane 104, the first carrier 602 and the optional adhesive material 604.

Figure 6B:
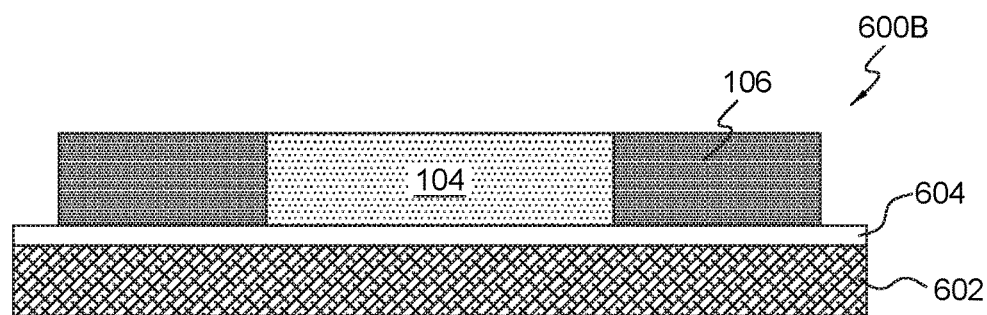

The silicon backplane, attached to the first carrier, may be molded (504) to form a second structure. An example 600B of the second structure is illustrated in FIG. 6B and includes the first structure 600A of FIG. 6A with the molding material surrounding sides of the silicon backplane 104. The molding material forms a substrate 106 with an embedded silicon backplane 104. In embodiments, a mold may be placed over the structure 600A, filled with the molding material and cured. Any excess molding material may be removed from the top surface of the silicon backplane if needed. In embodiments, the molding may be panel level molding, the molding material may be a polymer material, and the second structure 600B may be a plastic substrate with an embedded silicon backplane on a temporary substrate.

Figure 6C:
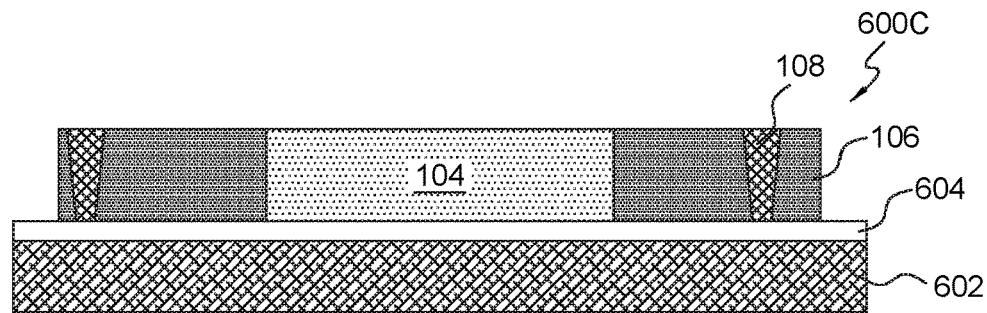

One or more vias may be formed through the substrate (506) to form a third structure. In embodiments, the one or more vias may be formed using lasers or drills. An example 600C of the third structure is illustrated in FIG. 6C and includes the silicon backplane 104 embedded in the substrate 106 with two vias 108 formed therethrough. At this stage, the silicon backplane 104 and substrate 106 with vias 108 may remain attached to the first temporary carrier 602. The vias 108 may be filled with a metal material.

At least one metal layer may be formed on one surface of the silicon backplane and the substrate (508). This may be done in a number of different ways.

Figure 6D:
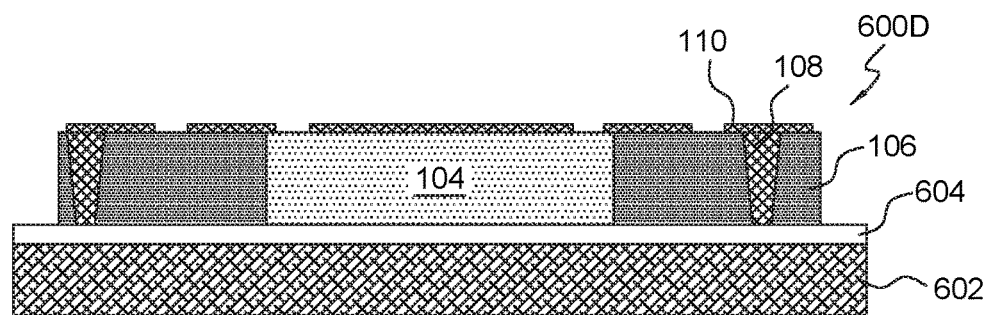

In some embodiments, a metal layer may be patterned or plated on the one surface of the silicon backplane and substrate to form a fourth structure. FIG. 6D illustrates an example 600D of the fourth structure, which includes the third structure with the metal layer 110. As can be seen in FIG. 6D, the metal layer 110 forms bond pads over the vias and regions that extend from a perimeter region of the silicon backplane 104. A metal layer is also provided on a central region of the one surface of the silicon backplane 104. The bottom view of the LED lighting system 100 illustrated in FIG. 1D shows an example of this.

In other embodiments, a metal layer may be formed on the one surface of the silicon backplane in a central region, and redistribution layers may be formed on the one surface of the silicon backplane and substrate adjacent the single metal layer to form a fifth structure. FIG. 6E illustrates an example 600E of the fifth structure, which includes the third structure with the single metal layer 618 and the redistribution layers 616. In the example illustrated in FIG. 6E, the redistribution layers 616 include layers of a dielectric material 614 and metal layers 612. While three metal layers are shown in FIG. 6E, one, two, or more than three metal layers may be used if needed due to design constraints. The redistribution layers may be formed, for example, by alternating deposition of layers of the dielectric material, selective removal of portions of the dielectric material (if needed), and patterning a layer of metal on top. As can be seen in FIG. 6E, the metal layers 612 begin in a perimeter region of the one surface of the silicon backplane and extend toward the side surfaces of the substrate. The metal layers 612 are electrically coupled between the silicon backplane 104 and the vias. A portion of the metal layers 612 is exposed from the dielectric material 614 to form a solder pad or separate solder pads may be formed on the outer-most surface of the outer-most dielectric layer.

Figure 6E:
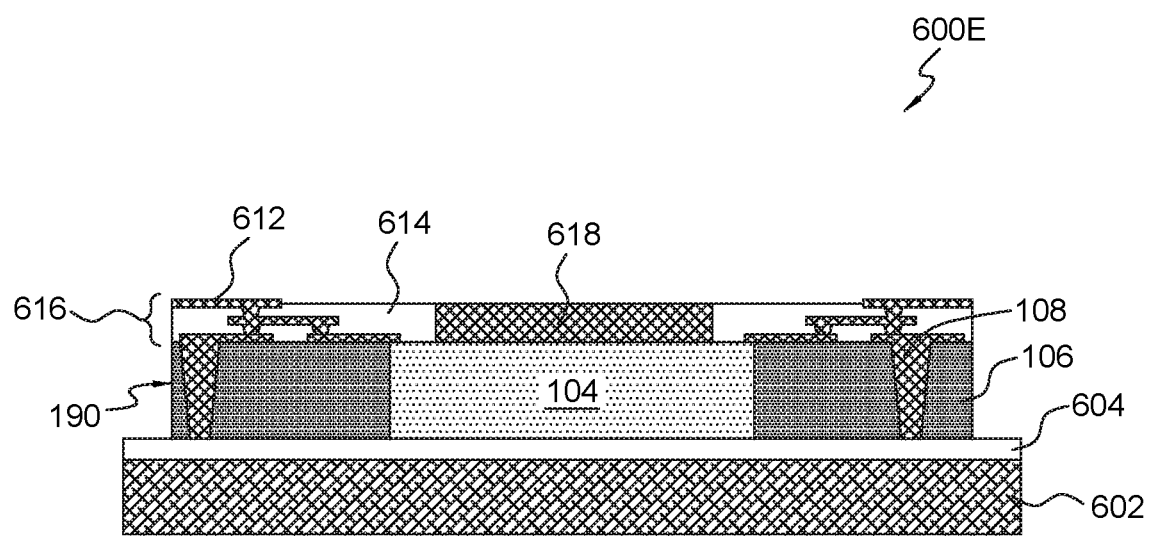
Figure 6F:
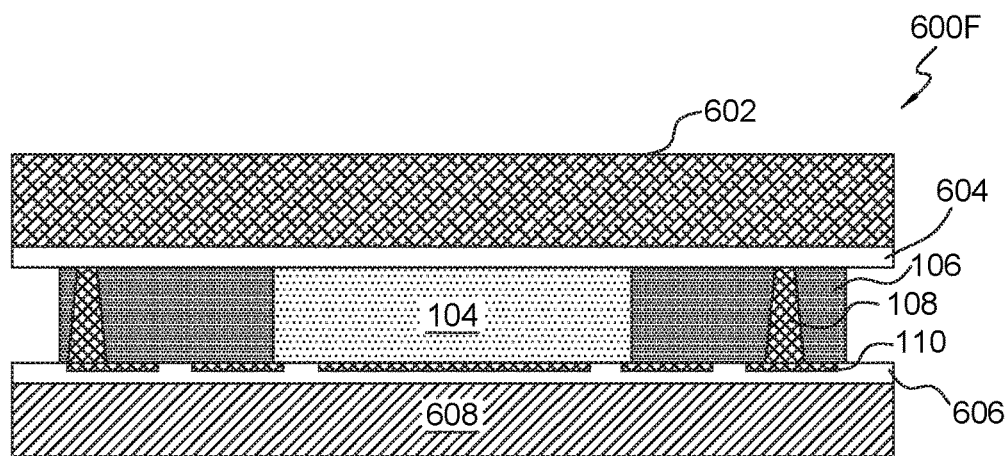
Figure 7:
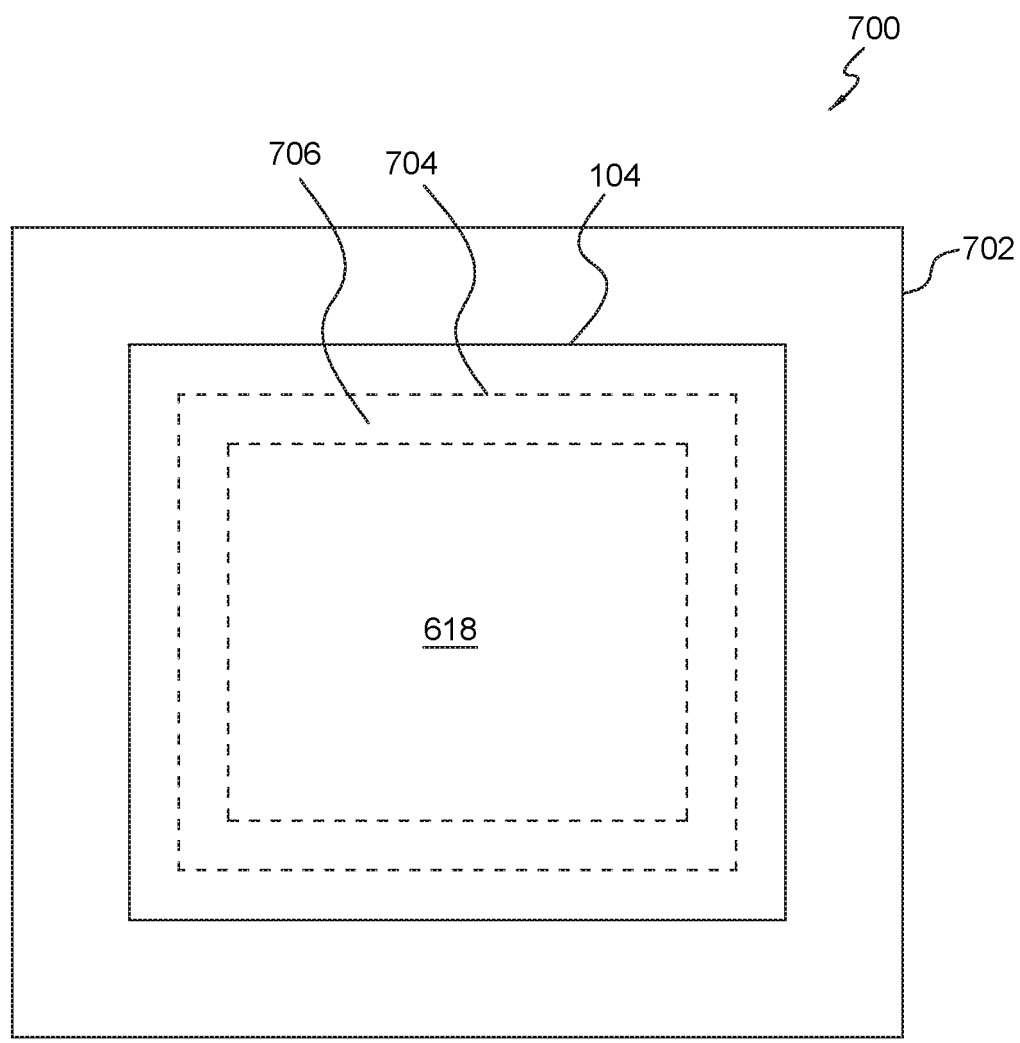
FIG. 7 is a bottom view representing the bottom surface of the LED lighting system of FIG. 6E.

FIG. 7 is a bottom view representing a bottom surface 700 of the LED lighting system of FIG. 6E. The line 702 represents the outer-most perimeter of the substrate. The line 104 represents the outer-most perimeter of a region occupied by the silicon backplane 104 relative to the outer-most perimeter of the substrate. The dashed line 704 denotes a border of a region between the line 704 and the outer-most perimeter of the silicon backplane 104, which may be referred to herein as the perimeter region of the silicon backplane 104. The metal layers 612 of the redistribution layers 616 may begin in the perimeter region and extend toward the side surfaces of the substrate (delineated by the line 702). There is a gap between the border 704 of the perimeter region of the silicon backplane and the single metal layer 618 formed on the one surface of the silicon backplane. This gap may be filled with the dielectric material, for example, as reflected in FIG. 6E.

Figure 6G:
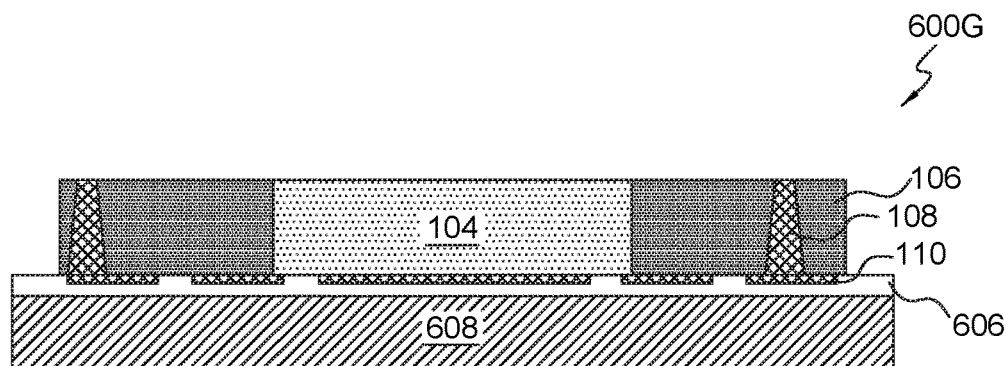

The structure formed as a result of 508 (e.g., the fourth or fifth structure) may be flipped and attached to a second carrier (510) to form a sixth structure. In embodiments, the structure (e.g., fourth or fifth structure) may be attached to a temporary (e.g., plastic) carrier via an adhesive material, such as a tape or temporary adhesive. The structure may be placed with the at least one metal layer adjacent the second carrier. An example 600G of the sixth structure is illustrated in FIG. 6G and includes the second carrier 608 and the optional adhesive material 606. Once the structure is attached to the second carrier, the first carrier may be removed (512) to form a seventh structure. An example 600G of the seventh structure is shown in FIG. 6G.

Figure 6H:
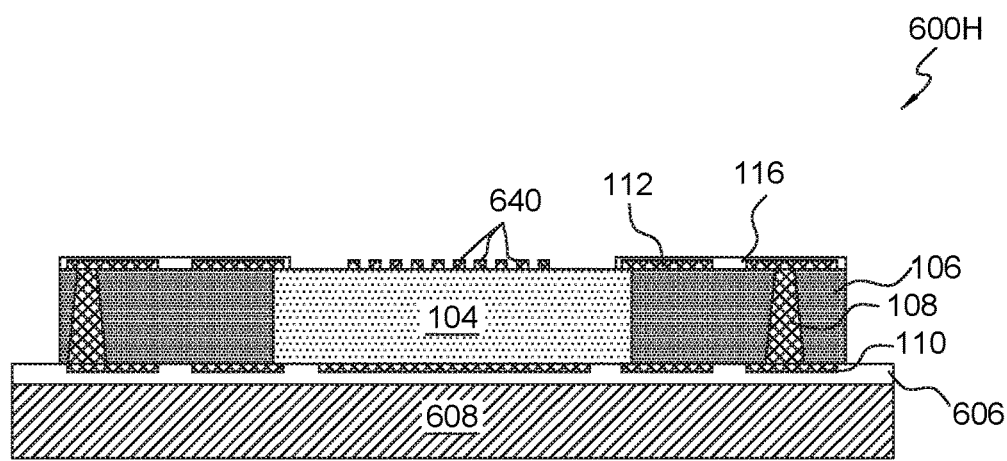

Redistribution layers and an array of metal connectors may be formed on the surface exposed by removal of the second carrier (514) to form an eighth structure. In embodiments, the array of metal connectors may be formed by plating or otherwise patterning or forming an array of copper pillar bumps on the surface. An example 600H of the eighth structure is illustrated in FIG. 6H and includes the metal connectors 640 and the redistribution layers 117, including the at least one metal layer 112 and the dielectric material 116. As described above with respect to FIG. 6E, the redistribution layers may be formed by alternating deposition of layers of the dielectric material, selective removal of portions of the dielectric material (if needed), and patterning a layer of metal on top. In embodiments, over 20,000 (e.g., approximately 28,000) metal connectors may be formed on the surface.

Figure 6I:
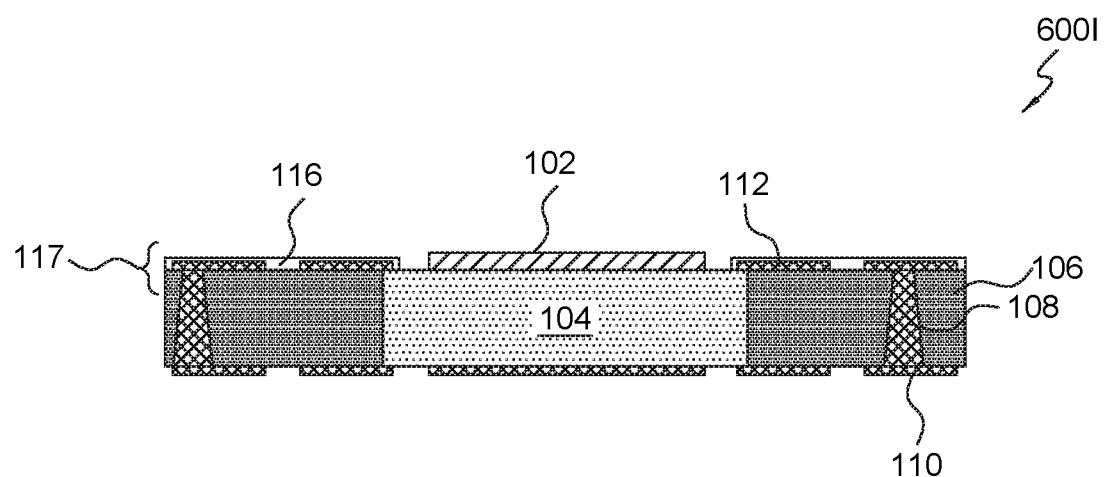
Figure 6J:
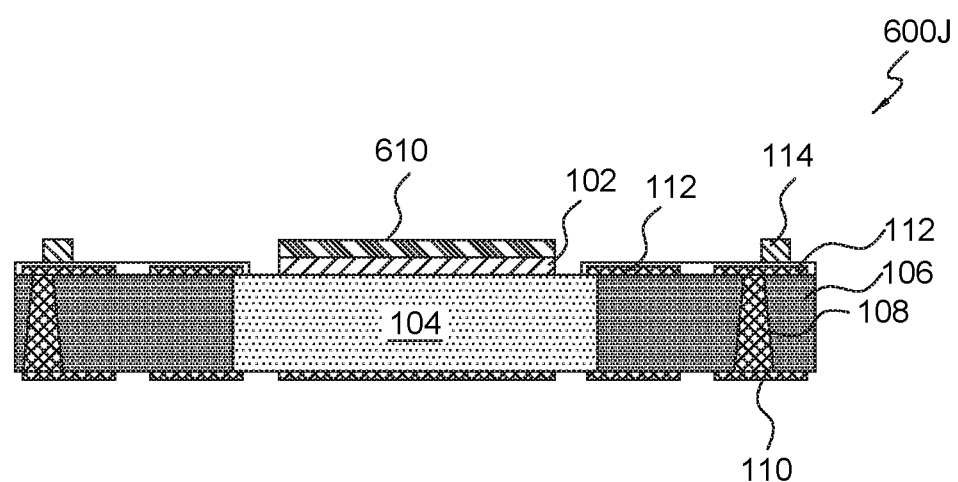

An LED array may be attached to the silicon backplane via the electrical connectors (516) to form a ninth structure. In embodiments, this may be performed by aligning the silicon backplane with the electrical connectors and heating to reflow the solder copper material in the copper pillar bumps. The reflow may create an underfill under the LED array. In embodiments, the LED array may be a monolithic LED array. An example 600I of the ninth structure is illustrated in FIG. 6I and includes the LED array 102 and the underfill.

The LED array may undergo a laser liftoff (LLO) process and phosphor integration (518). Any passive components may be mounted on the exposed metal regions in the redistribution layers 117 to form a tenth structure. An example 600J of the tenth structure is illustrated in FIG. 600J and includes the LED array 102 with the phosphor material 610 and passive components 114.

Optionally, the tenth structure, which may be an LED lighting system such as the LED lighting system 100 of FIG. 1B, may be mounted on an external circuit board (520) so as to, for example, incorporate the LED lighting system 100 into a vehicle headlamp or other application system.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described.

What is claimed is:

1. A system comprising:
   a silicon backplane having a top surface, a bottom surface, and side surfaces;
   an array of metal connectors on the top surface of the silicon backplane;
   a substrate surrounding the side surfaces of the silicon backplane, the substrate having a top surface, a bottom surface and side surfaces;
   first redistribution layers on the top surface of the silicon backplane and the top surface of the substrate;
   second redistribution layers on the bottom surface of the silicon backplane and the bottom surface of the substrate; and
   at least one via extending through the substrate between the first redistribution layers and the second redistribution layers and filled with a metal material.

2. The system of claim 1, wherein the first redistribution layers comprise:
   at least one first dielectric layer, and
   at least one first metal layer,
   the at least one first metal layer extending from a perimeter region of the silicon backplane toward the side surfaces of the substrate and having a least a portion exposed from the at least one dielectric layer to form at least one bond pad.

3. The system of claim 2, further comprising at least one passive component electrically coupled to the at least one bond pad.

4. The system of claim 1, wherein the second redistribution layers comprise:
   at least one second dielectric layer, and
   at least one second metal layer,
   the at least one second metal layer extending from a perimeter region of the silicon backplane toward the side surfaces of the substrate and having at least a portion exposed from the at least one dielectric layer to form at least one bond pad.

5. The system of claim 4, further comprising a metal layer electrically and thermally coupled to the bottom surface of the silicon backplane in a central region, the metal layer spaced apart from the second redistribution layers.

6. The system of claim 1, wherein the array of metal connectors is an array of copper pillar bumps.

7. The system of claim 1, further comprising a light-emitting diode (LED) array electrically coupled to the array of metal connectors.

8. The system of claim 7, wherein the LED array is a monolithic LED array.

9. The system of claim 8, wherein the monolithic LED array comprises a plurality of emitters, each of the plurality of emitters having a width of 100 µm or less.

10. The system of claim 9, wherein the plurality of emitters are arranged in rows and columns, and lanes between adjacent rows and columns have a width of 20 µm or less.

11. The system of claim 1, wherein the substrate comprises a molding material.

12. The system of claim 1, wherein the silicon backplane is a complementary metal-oxide semiconductor (CMOS) integrated circuit.

13. The system of claim 1, wherein the silicon backplane is an application specific integrated circuit (ASIC).

14. A vehicle headlamp system comprising:
   at least one sensor;
   a controller communicatively coupled to the at least one sensor;
   a light emitting diode (LED) driver; and
   an active headlamp, communicatively coupled to the controller and electrically coupled to the LED driver, the active headlamp comprising:
      a silicon backplane having a top surface, a bottom surface, and side surfaces,
      a substrate surrounding the side surfaces of the silicon backplane, the substrate having a top surface, a bottom surface, and side surfaces,
      redistribution layers on the top surface of the silicon backplane and the top surface of the substrate, the redistribution layers comprising at least one dielectric layer and at least one metal layer, the at least one metal layer extending from a perimeter region of the silicon backplane toward the side surfaces of the substrate and having a least a portion exposed from the at least one dielectric layer to form at least one bond pad, an LED array on the top surface of the silicon backplane.

15. The system of claim 14, wherein at least one of the at least one sensor, the controller and the driver comprises at least one passive component, and the at least one passive component is electrically coupled to the at least one bond pad.

16. The system of claim 14, wherein:
the active headlamp further comprises a metal layer electrically and thermally coupled to the bottom surface of the silicon backplane, and
the system further comprises a circuit board electrically and thermally coupled to the metal layer.

17. The system of claim 16, wherein the at least one passive component comprises a plurality of passive components, and at least one of the plurality of passive components is on the circuit board.

18. The system of claim 14, wherein the LED array is a monolithic LED array comprising a plurality of emitters, each of the plurality of emitters having a width of 100 μm or less.

19. The system of claim 18, wherein the plurality of emitters are arranged in rows and columns, and lanes between adjacent rows and columns have a width of 20 μm or less.

* * * * *